(12) United States Patent
Nachamkin et al.

(10) Patent No.: US 7,412,015 B2
(45) Date of Patent: Aug. 12, 2008

(54) DIGITAL SIGNAL PROCESSING REMEDIATION OF COSITE ANTENNA INTERFERENCE

(75) Inventors: Jack Nachamkin, Glen Mills, PA (US); Vincent Mancuso, Cinnaminson, NJ (US)

(73) Assignee: The Boeing Company, Chicago, IL (US)

( * ) Notice: Subject to any disclaimer, the term of this patent is extended or adjusted under 35 U.S.C. 154(b) by 750 days.

(21) Appl. No.: 10/920,510

(22) Filed: Aug. 18, 2004

(65) Prior Publication Data
US 2006/0039511 A1 Feb. 23, 2006

(51) Int. Cl.
*H03D 1/04* (2006.01)
(52) U.S. Cl. .................................... 375/350
(58) Field of Classification Search .............. 375/130, 375/267, 316, 346–350; 455/63.1, 132, 133–135
See application file for complete search history.

(56) References Cited

U.S. PATENT DOCUMENTS

| | | | | |
|---|---|---|---|---|
| 5,311,192 A | * | 5/1994 | Varga et al. | 342/188 |
| 5,485,485 A | * | 1/1996 | Briskman et al. | 375/130 |
| 5,596,600 A | * | 1/1997 | Dimos et al. | 375/148 |
| 5,796,779 A | * | 8/1998 | Nussbaum et al. | 375/267 |
| 5,872,540 A | | 2/1999 | Casabona et al. | |
| 6,980,614 B2 | * | 12/2005 | Miller et al. | 375/347 |
| 2001/0026602 A1 | | 10/2001 | Wiese et al. | |
| 2001/0028692 A1 | | 10/2001 | Wiese et al. | |
| 2004/0093158 A1 | | 5/2004 | Fielder | |

* cited by examiner

*Primary Examiner*—Khanh C Tran
(74) *Attorney, Agent, or Firm*—Harness, Dickey & Pierce, P.L.C.

(57) ABSTRACT

Methods and apparatus for separating desired signals from a mixed signal. A preferred method includes identifying the frequencies associated with the independent signals within the mixed signal and sampling the mixed signal once for each of the identified frequencies. Using the identified frequencies, a set of constant coefficients is determined and applied to the samples to separate at least one of the independent signals from the mixed signal. The other independent signals may then be suppressed. A signal processing system is also supplied that includes memory and a circuit. The memory stores samples of the mixed signal for the circuit to process. The circuit identifies the frequencies of the independent signals, determines a set of coefficients, and applies the coefficients to the mixed signal. Thus, the system separates a desired signal from the mixed signal.

18 Claims, 6 Drawing Sheets

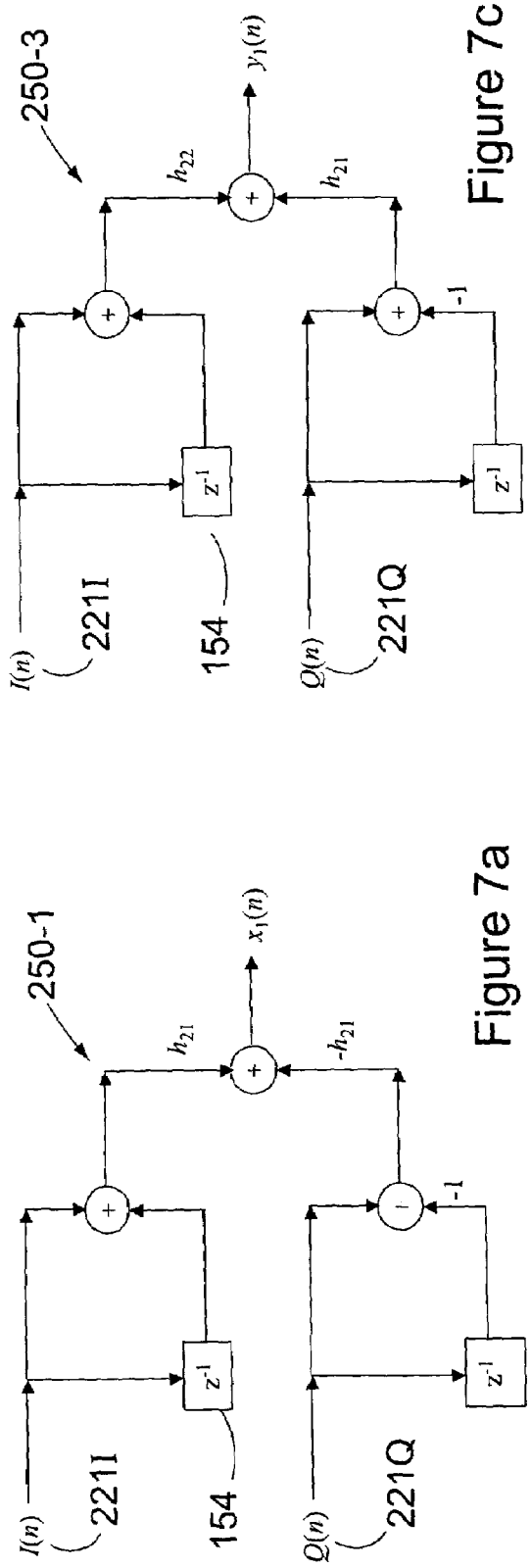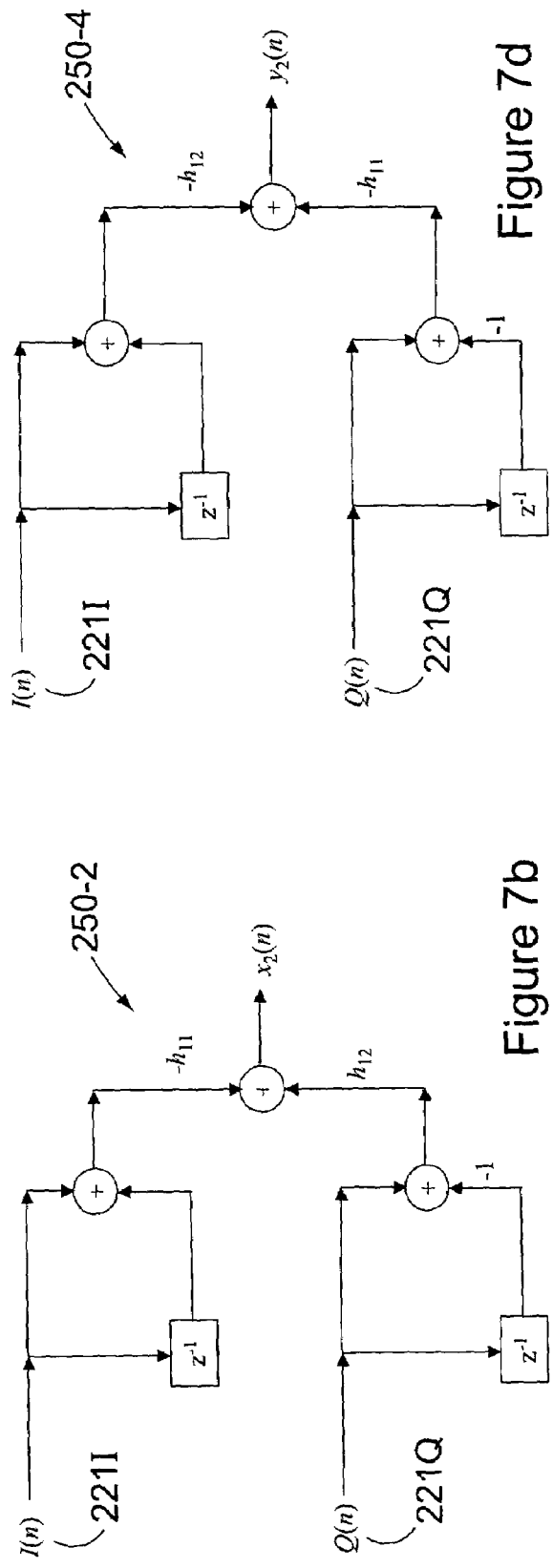

DIGITAL SIGNAL PROCESSING REMEDIATION OF COSITE ANTENNA INTERFERENCE

FIELD OF THE DISCLOSURE

This disclosure relates generally to methods and apparatus for receiving electromagnetic signals and, more particularly, to methods and apparatus for separating interfering signals from a desired signal_onboard a mobile platform wherein the interfering signal comes from an onboard transmitter.

BACKGROUND OF THE DISCLOSURE

Many military and commercial mobile platforms have numerous wireless systems for transferring information from one platform to another and with ground-based systems. These mobile platforms include aircraft, spacecraft, satellites, and many other devices. When one of the onboard wireless systems transmits a signal, part of the energy radiated from the antenna may couple to the antenna terminals of a nearby receiver, particularly a receiver operating at a frequency near the frequency of the transmitted signal. The resulting induced energy (undesired signal) in the receiving circuit will cause spurious responses and thereby prevent the receiver from detecting the signal which it is intended to receive.

As demand for connectivity increases these problems will become more pronounced and troublesome. For instance, as the traveling public takes increasing advantage of mobile Internet services (such as Connexion$^{SM}$ offered by the Boeing Company of Chicago, Ill.), it is envisioned that additional transceivers may be placed on many mobile platforms. Such systems are also needed on many types of military and commercial platforms, which include helicopters, fixed-wing aircraft, ships, and ground vehicles. Thus, an increasing number of systems are likely to become susceptible to interference from nearby transmitters. In particular, the current emphasis on small-unmanned aerial vehicles (UAVs) creates a need for filtering systems that can be integrated with these small airframes. Unfortunately, the size and weight of the previous filtering systems makes it impossible to integrate these systems onboard a UAV. Thus, previous attempts to solve the interference situation have, heretofore, proven unsatisfactory.

The previous techniques used for achieving compatibility between competing signals include: frequency management, analog filters, cryogenic filters, and even active cancellation systems. Frequency management is an administrated process requiring the operator to avoid simultaneously operating systems at the competing signals. While frequency management avoids degrading system performance, and avoids the addition of filters with their attendant weight penalties, frequency management also includes disadvantages. One disadvantage is that limiting the spectrum of frequencies available to the transceiver is limited. In the alternative, transceivers that share a frequency may only be operated sequentially therefore causing a loss of critical information at times. Additionally, the radio operator suffers an increased workload due to having to actively managing the system.

To avoid the complications required by frequency management, other attempts have used combinations of filters and amplifiers to suppress the undesired signals. The amplifiers are inserted between filter stages to compensate for the degradation of the desired signal caused by its pass through the filters. While some suppression of undesired signals may be realized by this technique, these systems are limited to applications in which the competing frequencies are not close together and in which the weight of the filters can be tolerated (i.e. not on mobile platforms). Also, as the inline insertion loss associated with the filters increases, the frequency separation between the desired and undesired signal increases.

The use of cryogenic liquids to cool the filters increases the filter efficiency to the point where the need for inter-stage amplifiers is eliminated. The elimination of the amplifiers is possible because the insertion in the pass band is minimal and the frequency separation between the desired and undesired signal is smaller when compared to the more non-cryogenic filters previously discussed. Thus, system performance is improved somewhat as compared to systems using non-cryogenic filters. However, these systems require heavy cryogenic components along with operational complications caused by the need to maintain cryogenic temperatures during operation (e.g. the filters take some time to cool down and the generation of even small amounts of heat in the filters can vaporize the cryogenic liquid).

Active cancellation systems have also been employed to alleviate the presence of the undesired signals. Active cancellation systems use amplifiers and phase shifters to cancel the undesired signals. Unfortunately, though, each receiver and the interfering transmitter(s) must be interconnected to the cancellation system. Thus, the interconnection creates a single point failure that can deny the use of all receivers connected to the cancellation system. Worse still, if a new transceiver system is added to the vehicle, the interconnection system must be redesigned and grows factorially in weight, size, and unreliability.

Thus a need exists to eliminate the interference caused by closely spaced antennas in a cost, power, and weight efficient manner without occupying undue space onboard mobile platforms.

SUMMARY OF THE DISCLOSURE

It is in view of the above problems that the present disclosure was developed. The disclosure provides methods and apparatus to separate a desired signal from interfering signals in a mixed signal.

Generally, the provided methods and apparatus utilize novel digital signal processing (DSP) techniques to suppress the undesired signal at the antenna terminals of wireless receivers in order to separate the desired signal from the undesired signal. Using these novel DSP techniques avoids the use of analog filtering stages. Weight reductions and significant financial savings are therefore achieved using lightweight inexpensive components.

In accordance with a first embodiment of the present disclosure a method of detecting a desired signal is provided. The in-phase and quadrature ("I" and "Q") components of a signal are generated with Hilbert-transform techniques. The resulting identified signals are sampled and filtered with a DSP algorithm. For the separation of "N" signals with known frequencies, a stream of samples is taken such that starting with the N-th sample, the different frequencies are separated into "N" streams of samples, each containing only a single frequency component of the N frequency components present.

In a second embodiment, an apparatus is provided that includes a method of separating a desired signal from a mixed signal. The method includes identifying the frequencies associated with several independent signals within the mixed signal and sampling the mixed signal once for each of the identified frequencies. Using the identified frequencies, a set of constant coefficients is determined and applied to the samples to separate at least one of the independent signals from the mixed signal. The other independent signals may then be suppressed. In other embodiments, the identification of the frequencies may be by way of generating the real and imaginary parts of the mixed signal (e.g. with a Hilbert Transform) or receiving an indication of the frequencies from a source associated with the independent signals. Further, the present embodiment allows for the separation of signals that are as little as approximately 1 percent of the desired signal's frequency apart. In yet other embodiments, the coefficients are based on trigonometric functions of the frequencies. Also, the mixed signal may be filtered prior to the sampling of it so as to prevent saturation of the sampling device. Further still, the desired and undesired signals may be within the same frequency band.

A signal processing system is also supplied that includes a memory and a circuit. The memory stores samples of a mixed signal for the circuit to process. The circuit identifies the frequencies of the independent signals within the mixed signal and determines a set of coefficients. The circuit also applies the coefficients to the mixed signal to separate a desired signal from the mixed signal. The circuit can be configured so that it does not attenuate the desired signal, but attenuates the undesired signal by up to about 70 decibels. Additionally, the system may be used on a mobile platform (e.g. an aircraft) with multiple receivers and electronically coupled to the antenna terminals of one of these receivers. Additionally, if the mobile platform has multiple antennas, they may be located in a common plane within as little as one foot from each other.

Further features and advantages of the present disclosure, as well as the structure and operation of various embodiments of the present disclosure, are described in detail below with reference to the accompanying drawings.

BRIEF DESCRIPTION OF THE DRAWINGS

The accompanying drawings, which are incorporated in and form a part of the specification, illustrate the embodiments of the present disclosure and together with the description, serve to explain the principles of the disclosure. In the drawings:

FIG. 7 further illustrates the circuit of FIGS. 3 and 4.

DETAILED DESCRIPTION

Figure 1:
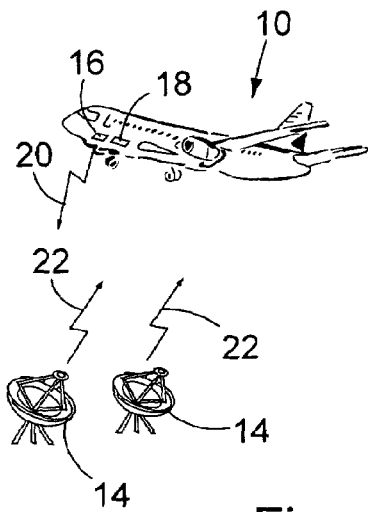
FIG. 1 illustrates an aircraft constructed in accordance with the principles of the present disclosure.

Referring to the accompanying drawings in which like reference numbers indicate like elements, FIG. 1 illustrates a mobile platform constructed in accordance with the principles of the present disclosure.

The mobile platform 10 illustrated by FIG. 1 is an aircraft 10 having numerous onboard systems. Many of these systems provide telecommunication capabilities that enable the aircraft 10 to accomplish a mission. These missions may include cooperation with other mobile platforms 12 and even ground-based systems 14. The aircraft 10 communicates with these other units 12 and 14 by way of antennas 16 and 18. Typically, both antennas 16 and 18 can transmit and receive electromagnetic (e.g. RF signals), although at times one antenna 16 will be receiving signals and the other 18 will be transmitting signals. Here, both antennas 16 and 18 are shown as panel antennas because of the aerodynamic requirements associated with the aircraft 10. In other embodiments, the antennas could be any type of known antenna without departing from the spirit of the present disclosure.

In operation, the systems onboard the aircraft 10 transmit signals 20 from one antenna 16 to the antennas 14 of other units. On the return side of the telecommunication system(s), the antenna 18 receives signals 22 from the antennas 14. Because the receiving antenna 18 may be in close proximity to the transmitting antenna 16, the transmitted signal 20 may couple to the receiving antenna 18 to some extent. The coupled energy appears at one or more receivers on the aircraft as an undesired signal (i.e. noise). Worse still, because the transmitting antenna 16 is relatively close to the receiving antenna 18, the undesired signal 20 (as coupled to the receiving antenna 18) is likely to have a strength many orders of magnitude higher than that of a particular signal 22 for which reception is highly desired. Thus, conventional receivers will likely have difficulty detecting the desired signal 22 in the presence of the strong undesired signal 20.

Figure 2:
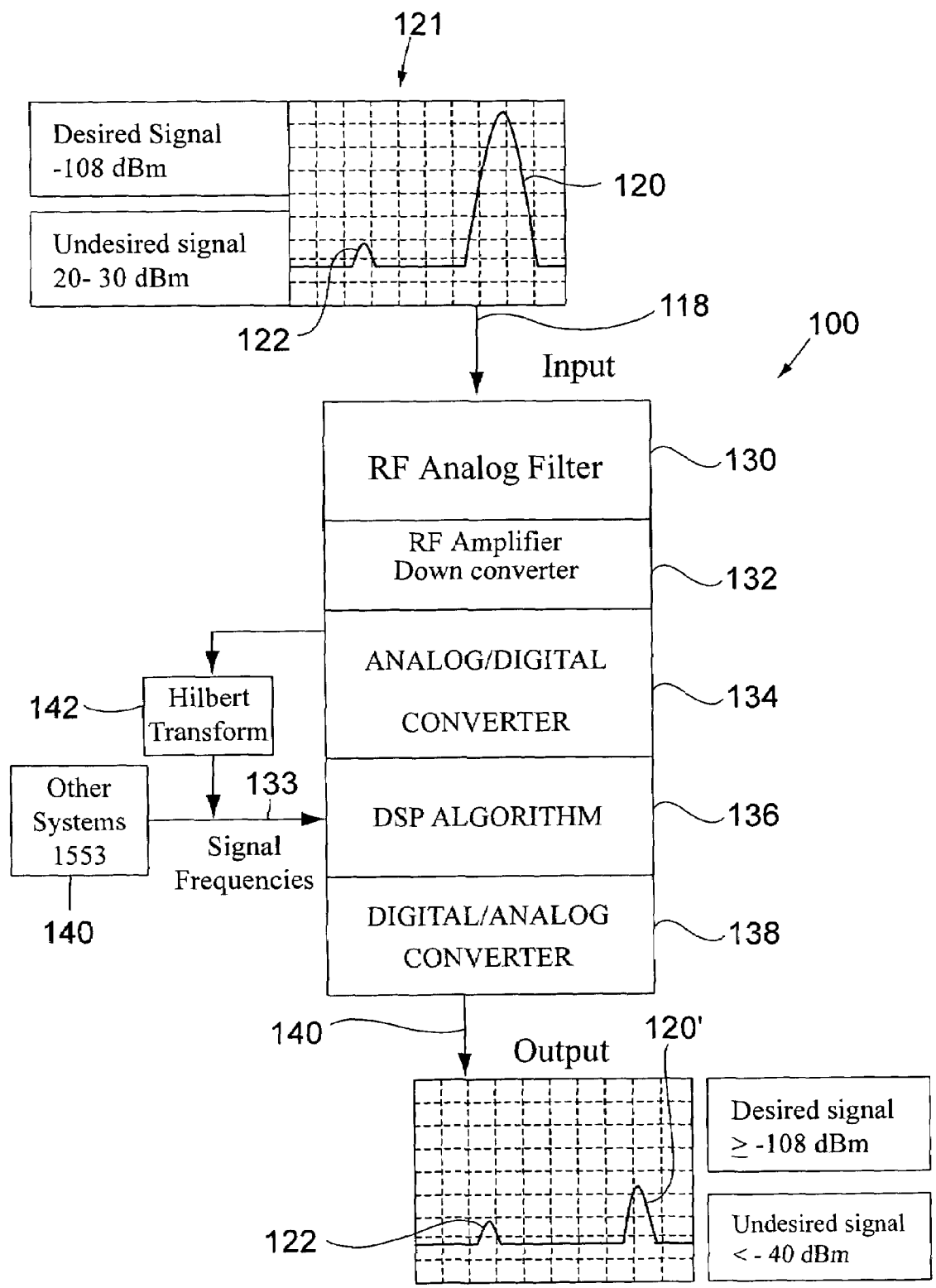
FIG. 2 illustrates a block diagram of a signal processor constructed in accordance with an embodiment of the present disclosure.

The present operation provides for the detection of the desired signal 22 even in the presence of many undesired signals 20. Interestingly, it has been observed that detection of the desired signal 22 by systems constructed in accordance with the principles of the present disclosure is enhanced as the number of undesired signals 20 increases. With reference now to FIG. 2, a system 100 constructed in accordance with the principles of the present embodiment is illustrated. The system 100 includes an optional analog filter 130, an optional amplifier 132, an analog/digital converter 134, a processor 136, a digital to analog converter 138, and an output 140. The input 118 of the system 100 may be an antenna, although the input 118 need not be a real-time wireless input. For instance, the input 118 could be a hardwired (e.g. copper) telecommunications link or even a fiber optic link. The input 118 accepts a mixed signal 121 including the undesired signal(s) 120 and the desired signal(s) 122.

From the input 118, the mixed signal 121 may be passed through the analog filter 130 and the optional amplifier 132. The purpose of the amplifier 132 is to condition the mixed signal for acceptance by the downstream stages of the system. In the alternative, a down converter could be included on the front end of the system 100 to convert the incoming mixed signal 121 to a lower frequency. The advantages of employing a down converter include lowering the sampling frequency associated with the DSP algorithms discussed herein. If the signal 121 is already suitable for the later stages, then the filter 130, amplifier 132, and down converter are unnecessary and may be dispensed with. In particular, since the filter 130 is only shown to prevent saturation of the amplifier 132 and analog-to-digital converter 132, it is generally unnecessary for the purposes of disclosing the invention and is shown only for illustrative purposes.

From the amplifier 132 the mixed signal 121 enters an analog-to-digital (A/D) converter 134 wherein it is digitized (sampled). The sampling rate may be independent of the Niquist rate needed to recreate the desired signal 122 without the occurrence of aliasing. Of course, a memory (e.g. a circular buffer) may be provided to store the samples for subsequent processing. From the A/D converter 134, the samples of the mixed signal 121 pass to the processor 136. In turn, the processor 136 operates on the samples 121 to separate the desired signal 122 from the undesired signals 120. Additionally, or alternatively, the processor 136 may suppress the undesired signal 120. As will be discussed, the algorithms employed by the processor 136 utilize knowledge of the frequency(s) associated with the signals 120 and 122. Thus a source 133 for the frequencies of the signals 120 and 122 is also shown as communicating with the processor 136. The frequency source 133 may be another system of the aircraft 10 that sends a message to the processor 136 conveying the frequencies (e.g. a general purpose computer communicating with the system 100 over a MIL-Spec-1553 data bus). In the alternative, the source 133 may utilize a Hilbert Transform 142 of the mixed signal 121 to identify the relevant frequencies. Using either source 133, it is estimated that the undesired signal 120' may be attenuated by approximately 70 decibels (without attenuating the desired signal 122) by employing the algorithms discussed herein. From the processor 136, the desired signal 122 may then be passed through a digital-to-analog converter 138 for subsequent use by systems in communication with the system 100. In the example shown, the undesired signal 120 has an initial strength of approximately 20-30 dBm while the desired signal 122 has a strength of approximately −108 dBm. After processing by the system 100, the undesired signal 120' will have a suppressed strength of −40 dBm while the strength of the desired signal 122 will be unchanged at −108 dBm. It has been found that comparative signal strengths such as these enable a conventional receiver to recover the desired signal 122 even in the presence of the undesired signal 120'. Further, it is estimated that system 100 can reside in devices as small as a credit card. The −108 dBm desired signal level (illustrated in FIG. 2) is based on the minimal detectable signal (MDS) requirement associated with many aircraft receivers. The 20-30 dBm level of the undesired signal 120 is based on UHF (225-400 MHz) antennas being separated by approximately 1 meter with a transmitter output power of about 10 watts (20 dBM) and 100 watts (30 dBm). No such limitations of the disclosure are implied. Rather, the user may select the MDS of the desired signal as well the other parameters associated with the system 100.

The processing performed by the system 100 is based on the following theoretical considerations. While the discussion assumes that only three signals are present in the mixed signal 121, the present disclosure is applicable to the mixed signal 121 with any number of independent signals 120 and 122. At least one of these signals is the desired signal 122. In the present embodiment two signals 122 are considered desired signals with a third signal being a relatively strong undesired signal 120. In one exemplary application a system for receiving even scores of signals is envisioned.

For the three signals of the present embodiment, the real and imaginary parts of the signals are represented, respectively, by Equation (1):

$$C(n) = \sum_{m=1}^{3} a_m \cos[n\omega_m \Delta t + \varphi_m]; \quad S(n) = \sum_{m=1}^{3} a_m \sin[n\omega_m \Delta t + \varphi_m] \quad (1)$$

After the mixed signal 121 passes through the filter 130 and is sampled by the converter 134, the components of the mixed signal 121 are represented by Equations (2), (3), (4), and (5).

$$C_+(n) = \frac{1}{2}[C(n) + C(n-2)] + \sum_{m=1}^{3} a_m \cos(\omega_m \Delta t)\cos[(n-1)\omega_m \Delta t + \varphi_m] \quad (2)$$

$$S_+(n) = \frac{1}{2}[S(n) + S(n-2)] = \sum_{m=1}^{3} a_m \cos(\omega_m \Delta t)\sin(n\omega_m \Delta t + \varphi_m) \quad (3)$$

$$C_-(n) = \frac{1}{2}[C(n) - C(n-2)] - \sum_{m=1}^{3} a_m \sin(\omega_m \Delta t)\sin[(n-1)\omega_m \Delta t + \varphi_m] \quad (4)$$

$$S_-(n) = \frac{1}{2}[S(n) - S(n-2)] = \sum_{m=1}^{3} a_m \sin(\omega_m \Delta t)\cos(n\omega_m \Delta t + \varphi_m) \quad (5)$$

For the real components (imaginary parts can be handled similarly), three equations with three unknowns can be written for each n>1:

$$\alpha_1 \cos[(n-1)\omega_1 \Delta t + \phi_1] + \alpha_2 \cos[(n-1)\omega_2 \Delta t + \phi_2] + \alpha_3 \cos[(n-1)\omega_3 \Delta t + \phi_3] = C(n-1) \quad (6)$$

$$\alpha_1 \cos(\omega_1 \Delta t)\cos[(n-1)\omega_1 \Delta t + \phi_1] + \alpha_2 \cos(\omega_1 \Delta t)\cos[(n-1)\omega_2 \Delta t + \phi_2] + \alpha_3 \cos(\omega_1 \Delta t)\cos[(n-1)\omega_3 \Delta t + \phi_3] = C_+(n) \quad (7)$$

$$\alpha_1 \sin(\omega_1 \Delta t)\cos[(n-1)\omega_1 \Delta t + \phi_1] + \alpha_2 \sin(\omega_1 \Delta t)\cos[(n-1)\omega_2 \Delta t + \phi_2] + \alpha_3 \sin(\omega_1 \Delta t)\cos[(n-1)\omega_3 \Delta t + \phi_3] = S_-(n) \quad (8)$$

Using the simultaneous Equations (6), (7), and (8) it is possible to solve for every real signal component for n>1. The matrix equation to be solved at each time step is thus:

$$\begin{bmatrix} 1 & 1 & 1 \\ \cos(\omega_1 \Delta t) & \cos(\omega_2 \Delta t) & \cos(\omega_3 \Delta t) \\ \sin(\omega_1 \Delta t) & \sin(\omega_2 \Delta t) & \sin(\omega_3 \Delta t) \end{bmatrix} \quad (9)$$

$$\begin{bmatrix} a_1 \cos[(n-1)\omega_1 \Delta t + \varphi_1] \\ a_2 \cos[(n-1)\omega_2 \Delta t + \varphi_2] \\ a_3 \cos[(n-1)\omega_3 \Delta t + \varphi_3] \end{bmatrix} = \begin{bmatrix} C(n-1) \\ C_+(n) \\ S_-(n) \end{bmatrix}$$

Equation (9) can be solved for each of the real components by inverting the matrix on the left side. For example, the quantity $\alpha_1 \cos[(n-1)\omega_1 \Delta t + \phi_1]$ can be obtained from Equation (9) as follows:

$$a_1 \cos[(n-1)\omega_1 \Delta t + \varphi_1] = \quad (10)$$

$$\frac{C(n-1)\sin(\omega_3 - \omega_2)\Delta t - C_+(n)[\sin(\omega_3 \Delta t) - \sin(\omega_2 \Delta t)] + S_-(n)[\cos(\omega_3 \Delta t) - \cos(\omega_2 \Delta t)]}{\sin(\omega_3 - \omega_2)\Delta t + \sin(\omega_2 - \omega_1)\Delta t + \sin(\omega_1 - \omega_3)\Delta t}$$

Many of the advantages of the present disclosure arise from the recognition that all of the coefficients of Equation (10) are scalar constants that can be calculated one time as soon as the frequencies of the signals 120 and 122 are known. The equations corresponding to the other inverted matrix coefficients of Equation 9 have similar, constant coefficients. Since these coefficients will not change until a new signal appears, the real-time computational load on the processor 136 is reduced as compared to previous suppression methods.

If a strong third signal is present with little other noise (as assumed for the present embodiment), then inverting the full set of equations is preferred. Remembering that aliasing does not affect phase angle, the preferred choice for "placement"

of the third frequency, if it is present, is approximately halfway between the other two, desired, frequencies. That is, if two systems are to receive signals and a third system is to transmit signals, it is preferred that the transmission frequency lie half way between the two reception frequencies.

If no third component is present, it is preferred to only solve the equation for the first two components in the matrix on the right side of simplified Equation 11 by using an over determined set to obtain a least-squares solution.

$$\begin{bmatrix} 1 & 1 \\ \cos(\omega_1 \Delta t) & \cos(\omega_2 \Delta t) \\ \sin(\omega_1 \Delta t) & \sin(\omega_2 \Delta t) \end{bmatrix} \begin{bmatrix} a_1 \cos[(n-1)\omega_1 \Delta t + \varphi_1] \\ a_2 \cos[(n-1)\omega_2 \Delta t + \varphi_2] \end{bmatrix} = \begin{bmatrix} C(n-1) \\ C_+(n) \\ -C_-(n) \end{bmatrix} \quad (11)$$

Figure 3:
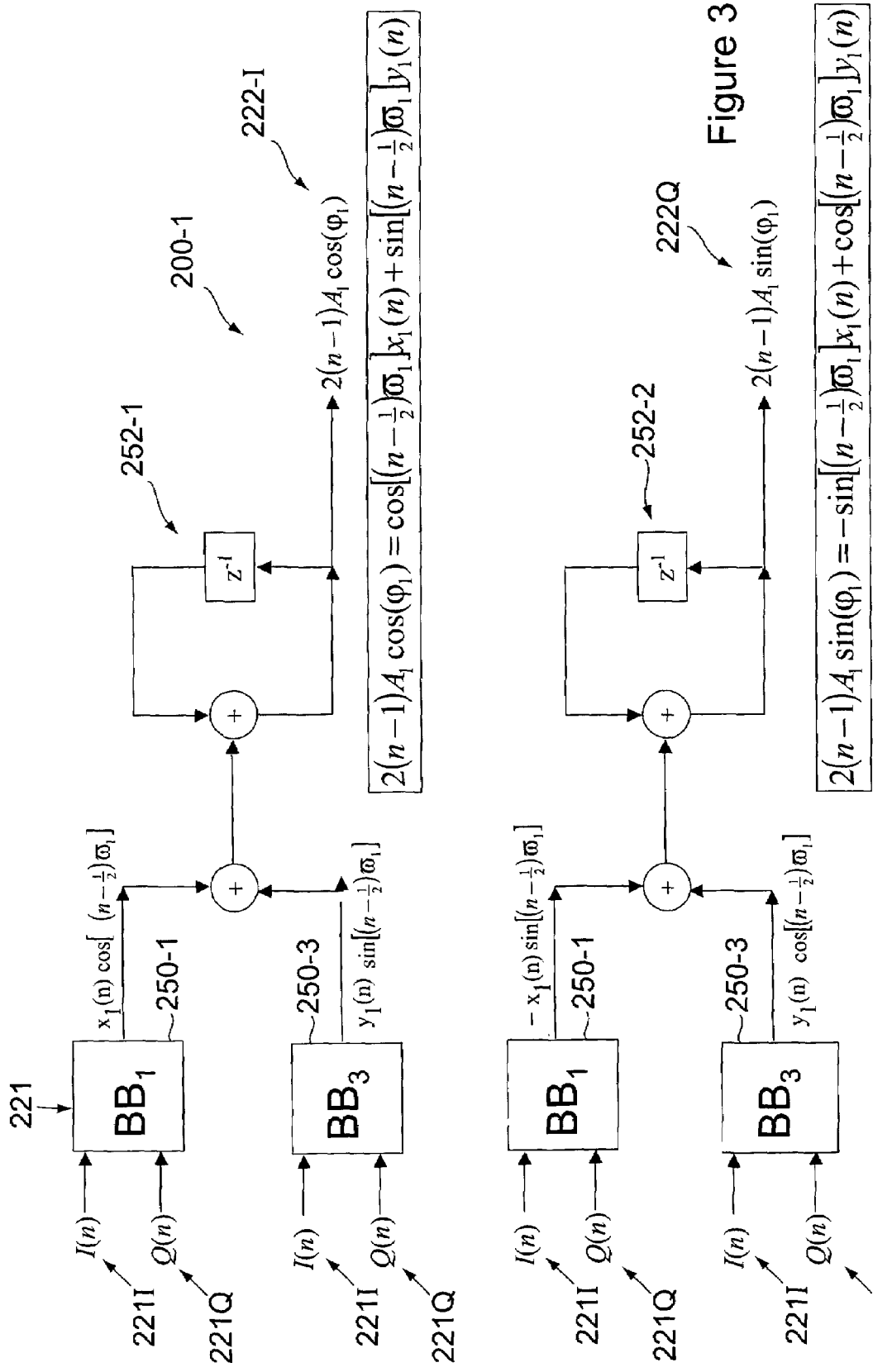
FIG. 3 illustrates a signal processing circuit constructed in accordance with another embodiment of the present disclosure.
Figure 4:
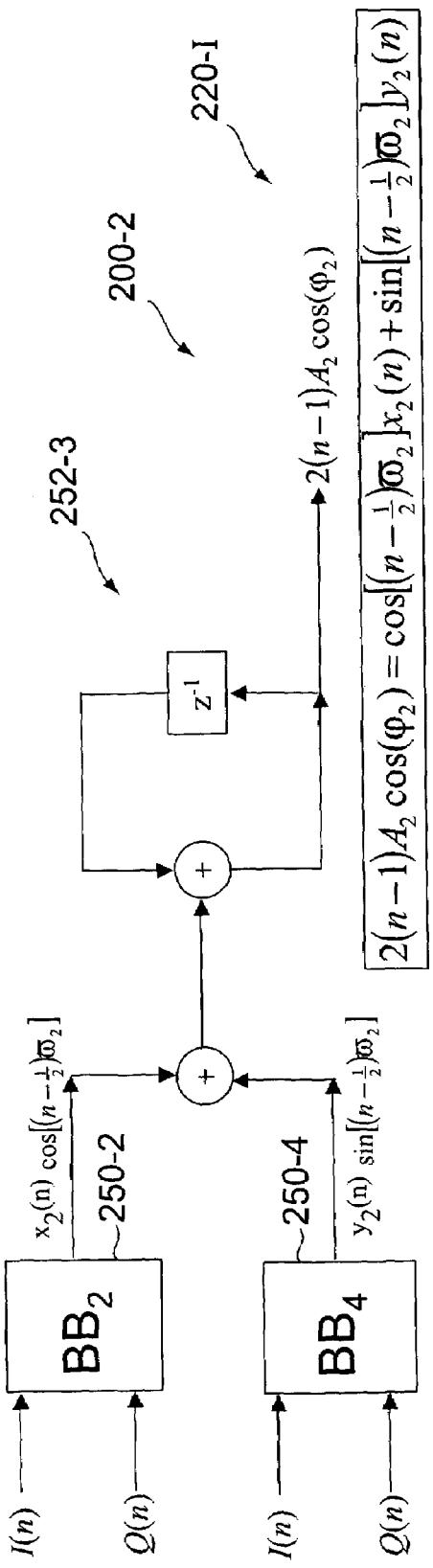
FIG. 4 further illustrates the circuit of FIG. 3.
Figure 4:
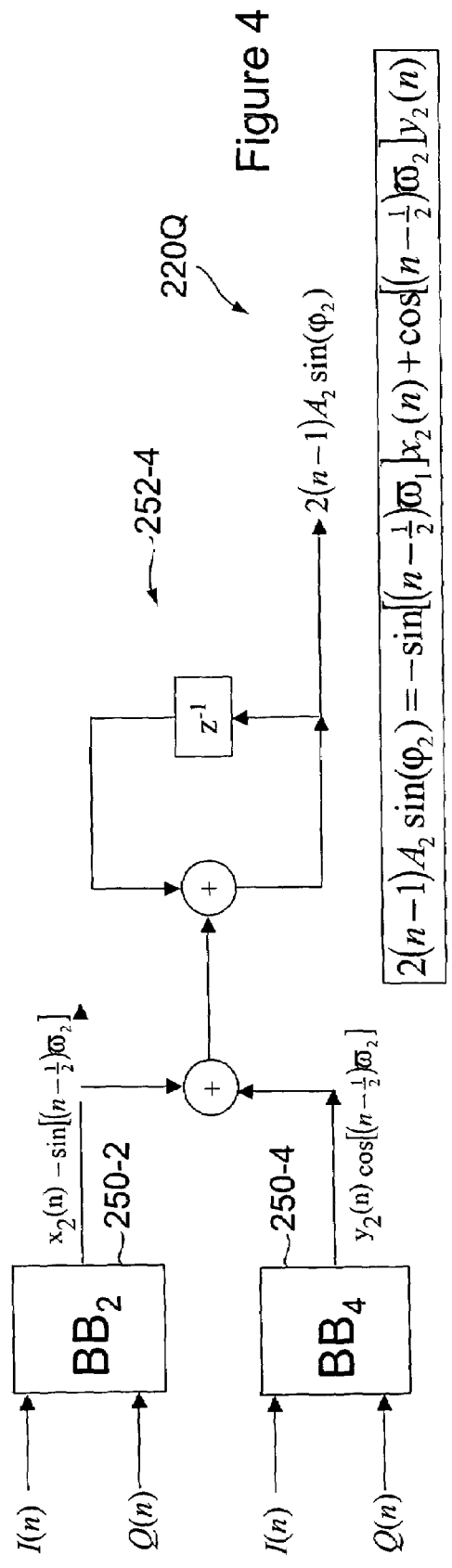

With reference now to FIGS. 3 and 4, a circuit 200 is shown schematically that accomplishes the processing of a mixed signal 221 (which includes an in-phase component 221I and a quadrature phase component 221Q) to separate two signals 220 and 222 (with respective in-phase [I] and quadrature phase [Q] components). The circuit 200 includes four initial summing/difference filters 250-1 to 250-4, and four final summing filters 252-1 to 252-4 that are connected as shown. Generally, the initial summing/difference filters 250 accept the sampled mixed signal 221 apply certain coefficients to the components of the mixed signal and partially combine the results. The final summing filters 252 further combine the results of the initial summing filters 250 to produce the separated signals 220 and 222.

In the general case, the mixed signal 221 will contain n independent signals at a set of known frequencies $\omega_k$, where k=1, 2, . . . N. In the continuous time domain, the signals are represented by Equation (12) where $A_k$ and $\phi_k$ are real.

$$S(t) = \sum_{k=1}^{N} A_k \exp(j\omega_k t + \varphi_k) \quad (12)$$

In the present embodiment, it is assumed that the mixed signal 221 has been previously sampled. As such the mixed signal is represented as in Equation (13). Interestingly, it has been observed that the circuit 200 separates the signals 220 and 222 even if the sampling rate is such that aliasing occurs. In other words, the sample rate need not be high enough to recreate any of the underlying signals 220 and 222. While not wishing to be held to any one theory, it is believed that the reason that aliasing does not affect separating the signals is that no signal re-creation takes place within the processing system 200. Rather, the suppression of an undesired signal 220 is sought. To preserve the integrity frequencies of the separated signals, it is preferred that the sampling rate follow the Nyquist criterion of being at least twice the frequency of the highest frequency signal to be separated. It is also preferred for the inverse of the width of the sampling pulses to be high enough to discern all of the signals to be separated. In practice this rarely a problem.

$$S(n) = \sum_{k=1}^{N} A_k \exp(j\omega_k n + \varphi_k) \quad (13)$$

For the simplified case with one undesired signal 220 and one desired signal 222, the coefficients applied by the initial filters 150 are shown in Equations (14) to (21). The matrix ‖h‖, and its coefficients h11, h12, h21, and h22 (along with the values given by Equations 18 to 21) is the matrix found in solving the set of simultaneous equations for the mixed signal 221 (for example Equation 9).

$$h_{11} = \sin\left(\frac{1}{2}\varpi_1\right) / \sin\left[\frac{1}{2}(\varpi_1 - \varpi_2)\right] \quad (14)$$

$$h_{12} = \cos\left(\frac{1}{2}\varpi_1\right) / \sin\left[\frac{1}{2}(\varpi_1 - \varpi_2)\right] \quad (15)$$

$$h_{21} = \sin\left(\frac{1}{2}\varpi_2\right) / \sin\left[\frac{1}{2}(\varpi_1 - \varpi_2)\right] \quad (16)$$

$$h_{22} = \cos\left(\frac{1}{2}\varpi_2\right) / \sin\left[\frac{1}{2}(\varpi_1 - \varpi_2)\right] \quad (17)$$

In addition, as soon as the frequencies $\omega_1$ and $\omega_2$ are known, it is preferable to calculate the sines and cosines values that will also be used subsequently, namely:

$$\sin\left[\varpi_1\left(\frac{1}{2} + m\right)\right] \quad (18)$$

$$\cos\left[\varpi_1\left(\frac{1}{2} + m\right)\right] \quad (19)$$

$$\sin\left[\varpi_2\left(\frac{1}{2} + m\right)\right] \quad (20)$$

$$\cos\left[\varpi_2\left(\frac{1}{2} + m\right)\right] \quad (21)$$

Once these coefficients and values are determined, the initial summing/difference filters 250 produce the following fours intermediate results. As shown by FIG. 7A, Filter 250-1 determines the in-phase component of the desired signal 222I, $x_1(n)$:

$$x_1(n) = h_{21}[I(n) + I(n-1)] - h_{22}[Q(n) - Q(n-1)] \quad (22)$$

Similarly, filter 250-2 (see FIG. 7B) determines the in-phase component of the undesired signal 220I, $x_2(n)$:

$$x_2(n) = h_{11}[I(n) + I(n-1)] + h_{12}[Q(n) - Q(n-1)] \quad (23)$$

Meanwhile, filer 250-3 (see FIG. 7C) determines the quadrature phase component of the desired signal 222Q, $y_1(n)$:

$$y_1(n) = h_{22}[I(n) + I(n-1)] + h_{21}[Q(n) - Q(n-1)] \quad (24)$$

As shown in FIG. 7D, filter 250-4 determines the quadrature phase component of the undesired signal 220Q, $y_2(n)$:

$$y_2(n) = -h_{12}[I(n) + I(n-1)] + h_{11}[Q(n) - Q(n-1)] \quad (25)$$

The filters 252-1 and 252-2 then combine the results of filters 250-1 and 250-3 to determine the in-phase and quadrature phase components 222I (i.e. $A_1 \cos \phi_1$) and 222Q (i.e. $A_1 \sin \phi_1$) of the desired signal 222. As illustrated in FIG. 3, the signal 222 is multiplied by a pre-determined constant, 2(n−1) at each sample. Similarly, filters 252-3 and 252-4 cooperate to produce the components of the undesired signal 220 (where 220I=$A_2 \cos \phi_2$ and 220Q=$A_2 \sin \phi_2$). Accordingly, the desired signal 222 has been separated from the mixed signal 221.

Either sampled signal 220 or 222 may then be passed through appropriate filters and digital-to-analog converters to produce the base-band signals 220 and 222. The general result is that a mixed signal 221 with N known different independent signals can be decomposed into base-band signals corresponding to the original signals 220 and 222 starting with the N-th sample (where N=2 is illustrated by FIG. 3). It has been observed in operation that constructing circuits 200 for separating odd numbers of independent signals tend to be easier to build than circuits for even numbers of independent signals. Further, in the preferred embodiment illustrated, the circuit 200 includes several averaging filters 154 (see Filter 150-1). However, these averaging filters 154 may be eliminated from the circuit, particularly after the N-th sample without adverse consequences.

Figure 6:
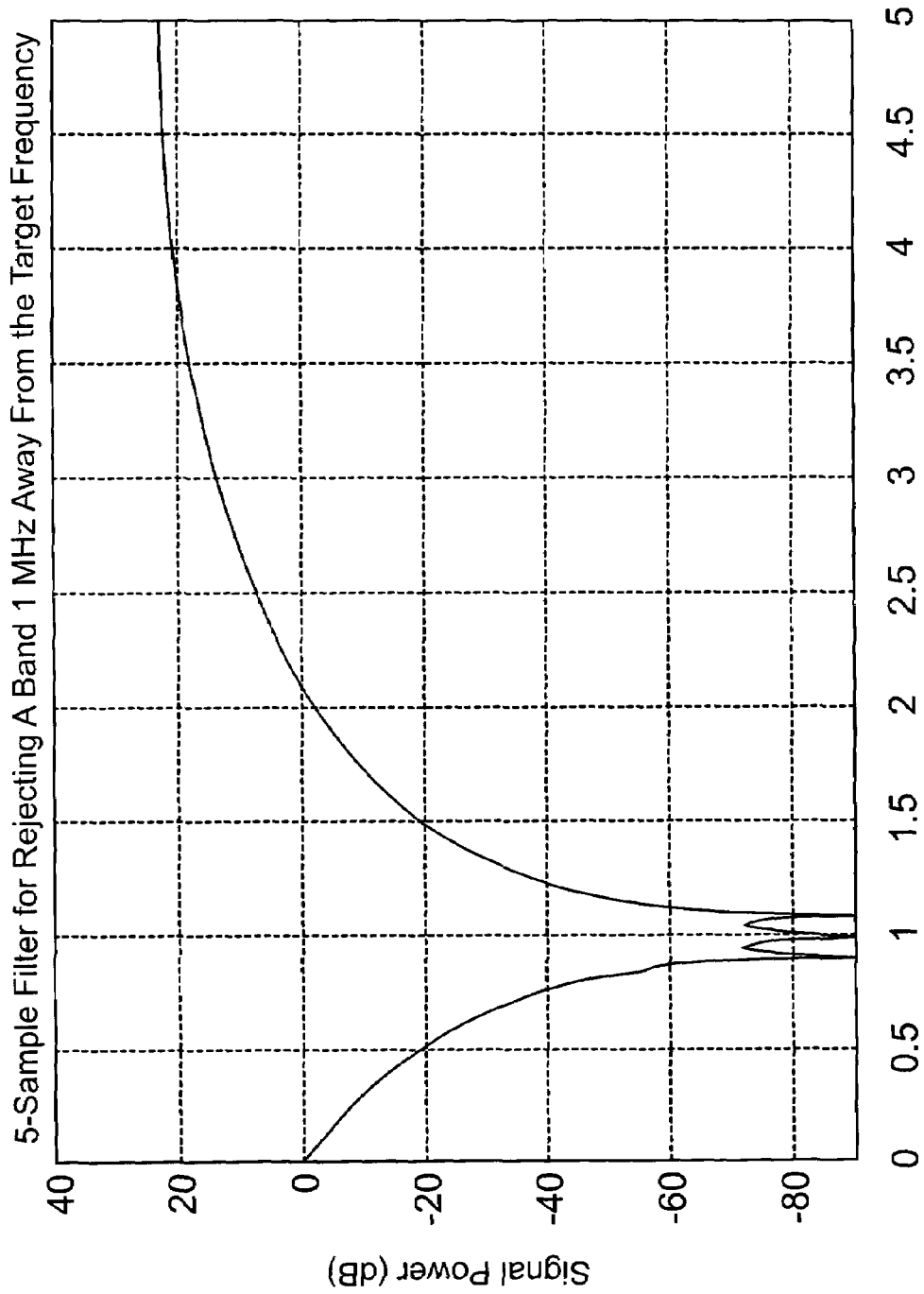
FIG. 6 illustrates the performance of a signal processing circuit constructed in accordance with the present disclosure.

FIG. 6, illustrates the performance of a signal separating circuit constructed in accordance with one embodiment of the present disclosure. The circuit of the present embodiment used five samples to reject an undesired signal that was only 1 MHz away from a desired signal at typical frequencies used in military communication systems. While analog filters can be applied outside of a frequency band in which the desired signal is, within the band the disadvantages of using analog filters become prohibitive. Thus, the present disclosure provides mechanisms for eliminating undesired signals within the band as shown in FIG. 6 by a −70 to −80 decibel attenuation of the undesired signal. The system 100 is capable of separating the signals, as shown, even when the frequency of the undesired signal 120 is within about 1 percent of the frequency of the desired frequency 122.

Figure 5:
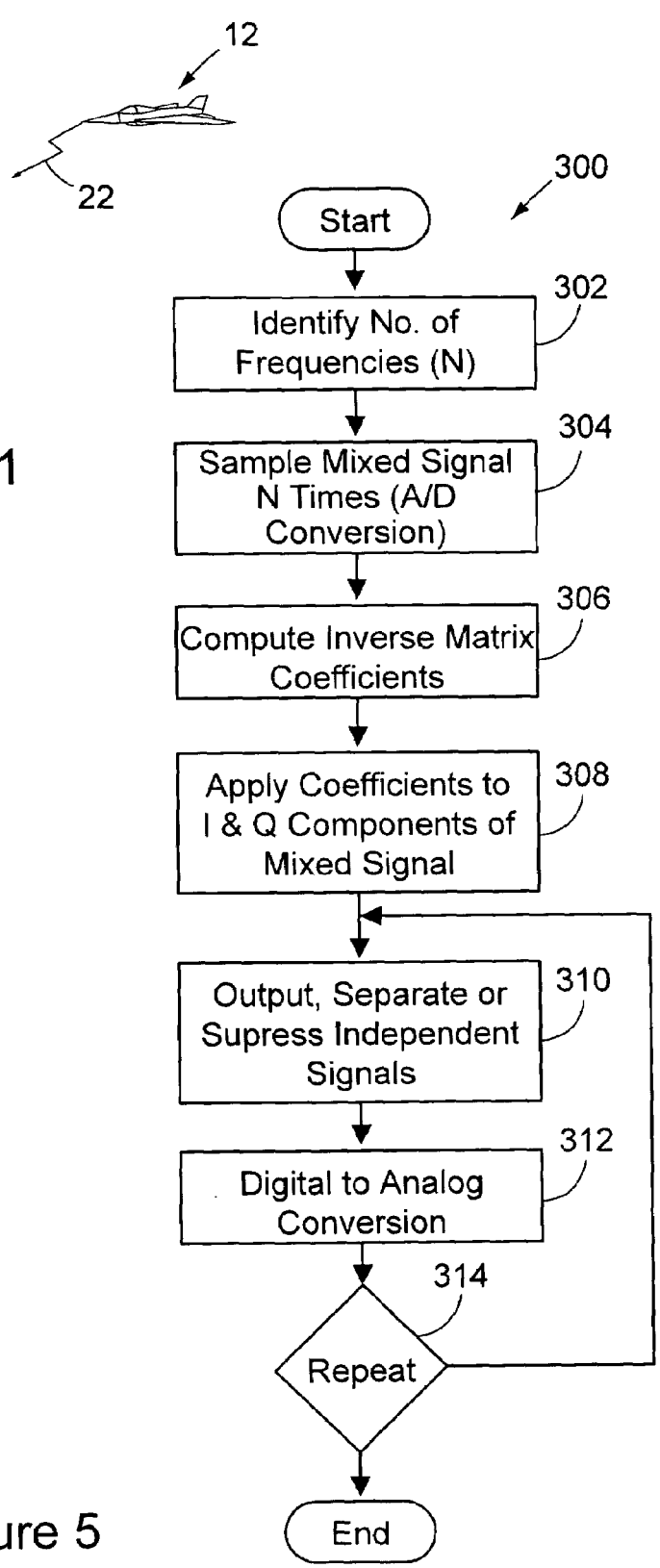
FIG. 5 illustrates a method in accordance with yet another embodiment of the present disclosure.

Turning now to FIG. 5, a method of separating independent signals from a mixed signal is illustrated. The method 300 includes identifying the number of frequencies that carry either undesired or desired signals, as in operation 302. For every frequency identified, a sample of the mixed signal is taken in operation 304. The coefficients used to separate the signals from the mixed signal are then determined. See operation 306. The coefficients are then applied to the components of the mixed signal in operation 308. The separated signals may, of course, be suppressed or output as separate signals as in operation 310. Operation 312 allows the separated signals to be converted to continuous form for subsequent use. Beginning with the 5th sample, subsequent samples of the mixed signal may then be processed to separate the independent signals as indicated by the loop back to step 310 from 314.

In view of the foregoing, it will be seen that the several advantages of the disclosure are achieved and attained. Signal processing methods and apparatus have been disclosed for separating desired signals from a mixed signal containing the desired signals along with, perhaps, undesired signals. Further, the present disclosure provides processors with low computational loads and rapid signal separation beginning upon the N-th sample. Also, the present disclosure provides separation apparatus and methods that are resistant to aliasing. Additionally, the provided signal systems and methods alleviate single point failures and do not require phase matching of the signals to separate the signals.

The embodiments were chosen and described in order to best explain the principles of the disclosure and its practical application to thereby enable others skilled in the art to best utilize the disclosure in various embodiments and with various modifications as are suited to the particular use contemplated.

As various modifications could be made in the constructions and methods herein described and illustrated without departing from the scope of the disclosure, it is intended that all matter contained in the foregoing description or shown in the accompanying drawings shall be interpreted as illustrative rather than limiting. Thus, the breadth and scope of the present disclosure should not be limited by any of the above-described exemplary embodiments, but should be defined only in accordance with the following claims appended hereto and their equivalents.

What is claimed is:

1. A method of separating n independent signals from a mixed signal of the independent signals, each of the independent signals having a frequency associated therewith, the method comprising:
   identifying the frequencies associated with the independent signals by using a received indication of frequency of at least one of the independent signals obtained from a source associated with the at least one of the independent signals;
   sampling the mixed signal at least n times;
   using the identified frequencies, determining a set of constant coefficients that when applied to the n samples separates a sampled representation of at least one of the independent signals from the sampled mixed signal; and
   wherein the method operates to detect frequencies associated with a pair of said independent signals that are up to about one percent of the frequency of one of the independent signals apart.

2. The method according to claim 1, the identifying the frequencies further comprising generating real and imaginary parts of the mixed signal.

3. The method according to claim 2, wherein the generating the real and imaginary parts of the mixed signal further comprises using a Hilbert transform.

4. The method according to claim 1, wherein n is equal to 2.

5. The method according to claim 1, wherein n is greater than 2.

6. The method according to claim 1 wherein the coefficients are trigonometric functions of the frequencies.

7. The method according to claim 1, further comprising filtering the mixed signal before the sampling.

8. The method according to claim 1, wherein a frequency of at least one of the independent signals is in a different band than the frequencies of the other independent signals.

9. The method according to claim 1, the sampling further comprising being at a rate sufficient to recreate the independent signal with the highest identified frequency.

10. The method according to claim 1, further comprising averaging at least two of the n samples.

11. A signal processing system comprising:
    an input to accept a mixed signal of n independent signals, each of the independent signals occurring at a frequency;
    a memory to store n samples of the mixed signal;
    a circuit to:
      identify the frequencies of the independent signals using indications received from sources of the independent signals;
      from the identified frequencies, determine a set of constant coefficients,
      apply the constant coefficients to the real and the imaginary parts of the sampled mixed signal to separate a sampled representation of at least one of the independent signals from the sampled mixed signal; and
    an output to output the sampled representation of the at least one independent signal; and
    wherein the frequencies associated with a pair of the independent signals are up to about one percent of the frequency of one of the independent signals apart.

12. The signal processing system according to claim 11, wherein the system does not attenuate the at least one signal as output and wherein the system attenuates at least one other independent signal by up to about 70 decibels.

13. The signal processing system according to claim 11, wherein n is equal to 2.

14. The signal processing system according to claim 11, further comprising a filtering interposed between the input and the circuit.

15. A mobile platform comprising:
- at least one antenna;
- a plurality of systems communicating with the at least one antenna, each system adapted to receive an independent signal with a frequency from the at least one antenna; and
- a signal processing system further comprising:
  - an input to accept a mixed signal of n independent signals from the at least one antenna, each of the independent signals occurring at a frequency, with said frequency of each said independent signal being indicated by information received from its source;
  - a memory to store n samples of the mixed signal;
  - a circuit to:
    - identify the frequencies of the independent signals,
    - from the identified frequencies, determine a set of constant coefficients, and
    - apply the constant coefficients to the real and the imaginary parts of the sampled mixed signal to separate a sampled representation of at least one of the independent signals from the sampled mixed signal; and
  - an output to output the sampled representation of the at least one independent signal to the plurality of systems.

16. The mobile platform according to claim 15, the at least one antenna comprising a first and a second antenna, the antennas being coplanar and located within 1 meter of each other.

17. The mobile platform according to claim 15, wherein the mobile platform is an aircraft.

18. The mobile platform according to claim 15, further comprising the receiver further comprising an antenna terminal, the signal processor electrically coupled to the terminal.

* * * * *